(12) United States Patent
Lee et al.

(10) Patent No.: US 12,738,464 B2
(45) Date of Patent: Sep. 15, 2026

(54) SUBSTRATE TREATMENT APPARATUS AND SEMICONDUCTOR DEVICE MANUFACTURING METHOD USING THE SAME

(71) Applicant: Samsung Electronics Co., Ltd., Suwon-si (KR)

(72) Inventors: Woo Hyun Lee, Daejeon (KR); Su Ji Gim, Hwaseong-si (KR); Dong Jun Ka, Suwon-si (KR); Kyung Nam Kang, Hwaseong-si (KR); Hong Sik Park, Suwon-si (KR); Deok Cheon Son, Hwaseong-si (KR); Jeong Yeon Song, Hwaseong-si (KR); Sun Hee Choy, Jeonju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 661 days.

(21) Appl. No.: 17/974,045

(22) Filed: Oct. 26, 2022

(65) Prior Publication Data

US 2023/0238226 A1 Jul. 27, 2023

(30) Foreign Application Priority Data

Jan. 27, 2022 (KR) ........................ 10-2022-0011974

(51) Int. Cl.
*H01J 37/32* (2006.01)
*C23C 16/44* (2006.01)
(Continued)

(52) U.S. Cl.
CPC .... *H01J 37/32816* (2013.01); *C23C 16/4405* (2013.01); *C23C 16/45536* (2013.01);
(Continued)

(58) Field of Classification Search
CPC .......... H01L 21/28568; H01J 37/32357; H01J 37/32816; H01J 37/3244; H01J 37/32733;
(Continued)

(56) References Cited

U.S. PATENT DOCUMENTS 6,274,058 B1 8/2001 Rajagopalan et al.
10,688,538 B2 6/2020 Shah et al.
(Continued)

FOREIGN PATENT DOCUMENTS

KR 1020060092979 A 8/2006
KR 20080050401 A 6/2008
(Continued)

*Primary Examiner* — Joseph A Miller, Jr.
(74) *Attorney, Agent, or Firm* — Muir Patent Law, PLLC

(57) ABSTRACT

A semiconductor device manufacturing method comprising loading a substrate into a substrate treatment apparatus, performing a deposition process on the substrate, and cleaning the substrate treatment apparatus. The substrate treatment apparatus includes a housing defining a treatment area in which the deposition process is performed, a gas supply supplying a first process gas at a flow rate of 1000 sccm to 15000 sccm and supplying a second process gas, a remote plasma supply connected to the gas supply, generating a first process plasma and a second process plasma by applying RF power to plasma-process the first process gas and the second process gas, and a shower head installed in the housing to supply the first process plasma and the second process plasma to the treatment area. The second process plasma cleans a membrane material deposited on an inner wall of the housing.

11 Claims, 14 Drawing Sheets

(51) Int. Cl.
*C23C 16/455* (2006.01)
*C23C 16/505* (2006.01)
*H10P 14/40* (2026.01)

(52) U.S. Cl.
CPC ...... *C23C 16/45565* (2013.01); *C23C 16/505* (2013.01); *H01J 37/32357* (2013.01); *H01J 37/3244* (2013.01); *H01J 37/32743* (2013.01); *H10P 14/418* (2026.01); *H01J 37/32082* (2013.01); *H01J 37/32862* (2013.01); *H01J 2237/182* (2013.01); *H01J 2237/3321* (2013.01)

(58) Field of Classification Search
CPC .......... C23C 16/4405; C23C 16/45565; C23C 16/452
See application file for complete search history.

(56) References Cited

U.S. PATENT DOCUMENTS

| | | | | |
|---|---|---|---|---|
| 10,755,903 | B2 | 8/2020 | Bhatia et al. | |
| 2003/0029475 | A1* | 2/2003 | Hua .................... | C23C 16/4405 134/1.1 |
| 2004/0127033 | A1* | 7/2004 | Takatsuki .......... | H01J 37/32541 438/689 |
| 2007/0209686 | A1 | 9/2007 | Bae et al. | |
| 2011/0045676 | A1* | 2/2011 | Park ...................... | C23C 16/401 438/771 |
| 2018/0350571 | A1 | 12/2018 | Zhai et al. | |

FOREIGN PATENT DOCUMENTS

| | | | |
|---|---|---|---|
| KR | 20080050402 | A | 6/2008 |
| KR | 20080088788 | A | 10/2008 |
| KR | 1020140034106 | A | 3/2014 |

* cited by examiner

SUBSTRATE TREATMENT APPARATUS AND SEMICONDUCTOR DEVICE MANUFACTURING METHOD USING THE SAME

CROSS-REFERENCE TO RELATED APPLICATION

This application claims priority from Korean Patent Application No. 10-2022-0011974 filed on Jan. 27, 2022 in the Korean Intellectual Property Office and all the benefits accruing therefrom under 35 U.S.C. 119, the contents of which in its entirety are herein incorporated by reference.

BACKGROUND

Technical Field

The present disclosure relates to a substrate treatment apparatus and a semiconductor device manufacturing method using the same.

Description of the Related Art

Generally, plasma is widely used for manufacturing processes of semiconductor devices, plasma display panels (PDPs), liquid crystal displays (LCDs), solar cells, etc. Examples of a main process for which plasma is used include dry etching, plasma enhanced chemical vapor deposition (PECVD), sputtering, and ashing. Capacitively coupled plasma (CCP), inductively coupled plasma (ICP), a mixture of CCP and ICP, Helicon plasma, microwave plasma, etc. are typically used for the plasma process. The plasma process is directly related to plasma variables (e.g., electron density, electron temperature, ion flux, and ion energy), and particularly, plasma density and plasma uniformity may significantly affect product reliability and production.

BRIEF SUMMARY

An object of the present disclosure is to provide a semiconductor device manufacturing method in which efficiency is improved.

Another object of the present disclosure is to provide a substrate treatment apparatus in which efficiency is improved.

The objects of the present disclosure are not limited to those mentioned above and additional objects of the present disclosure, which are not mentioned herein, will be clearly understood by those skilled in the art from the following description of the present disclosure.

According to an aspect of the present disclosure, there is provided a semiconductor device manufacturing method comprising, loading a substrate into a substrate treatment apparatus, performing a deposition process on the substrate, and cleaning the substrate treatment apparatus, wherein the substrate treatment apparatus includes a housing defining a treatment area in which the deposition process is performed, a gas supply supplying a first process gas at a flow rate of 1000 sccm to 15000 sccm and supplying a second process gas, a remote plasma supply connected to the gas supply, generating a first process plasma and a second process plasma by applying RF power to plasma-process the first process gas and the second process gas, and a shower head installed in the housing to supply the first process plasma and the second process plasma to the treatment area, wherein the second process plasma cleans a membrane material deposited on an inner wall of the housing.

According to another aspect of the present disclosure, there is provided a substrate treatment apparatus comprising, a housing defining a treatment area in which a substrate is treated, a gas supply supplying a first process gas at a flow rate of 1000 sccm to 15000 sccm and supplying a second process gas, a remote plasma supply connected to the gas supply, generating a first process plasma and a second process plasma by applying RF power to plasma-process the first process gas and the second process gas, and a shower head installed in the housing to supply the first process plasma and the second process plasma to the treatment area, wherein the second process plasma cleans a membrane material deposited on an inner wall of the housing.

According to another aspect of the present disclosure, there is provided a substrate treatment apparatus comprising, a housing defining a treatment area in which a deposition process is performed for a substrate, a gas supply supplying an argon (Ar) gas at a flow rate of 3000 sccm to 4000 sccm and supplying a process gas, a remote plasma supply connected to the gas supply, generating an argon plasma and a process plasma by applying RF power to plasma-process the argon (Ar) gas and the process gas, a shower head installed in the housing to supply the argon (Ar) plasma and the process plasma to the treatment area, and pump for adjusting a pressure inside the housing between a first pressure and a second pressure, wherein the process plasma cleans a membrane material deposited on an inner wall of the housing, the cleaning the membrane material deposited on the inner wall of the housing includes a first step executed at the first pressure and a subsequent second step executed at the second pressure which is less than the first pressure, and the deposition process includes a chemical vapor deposition (CVD) method and an atomic layer deposition (ALD) method.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DISCLOSURE

Hereinafter, embodiments according to technical aspects of the present disclosure will be described in detail with reference to the accompanying drawings.

Figure 1:
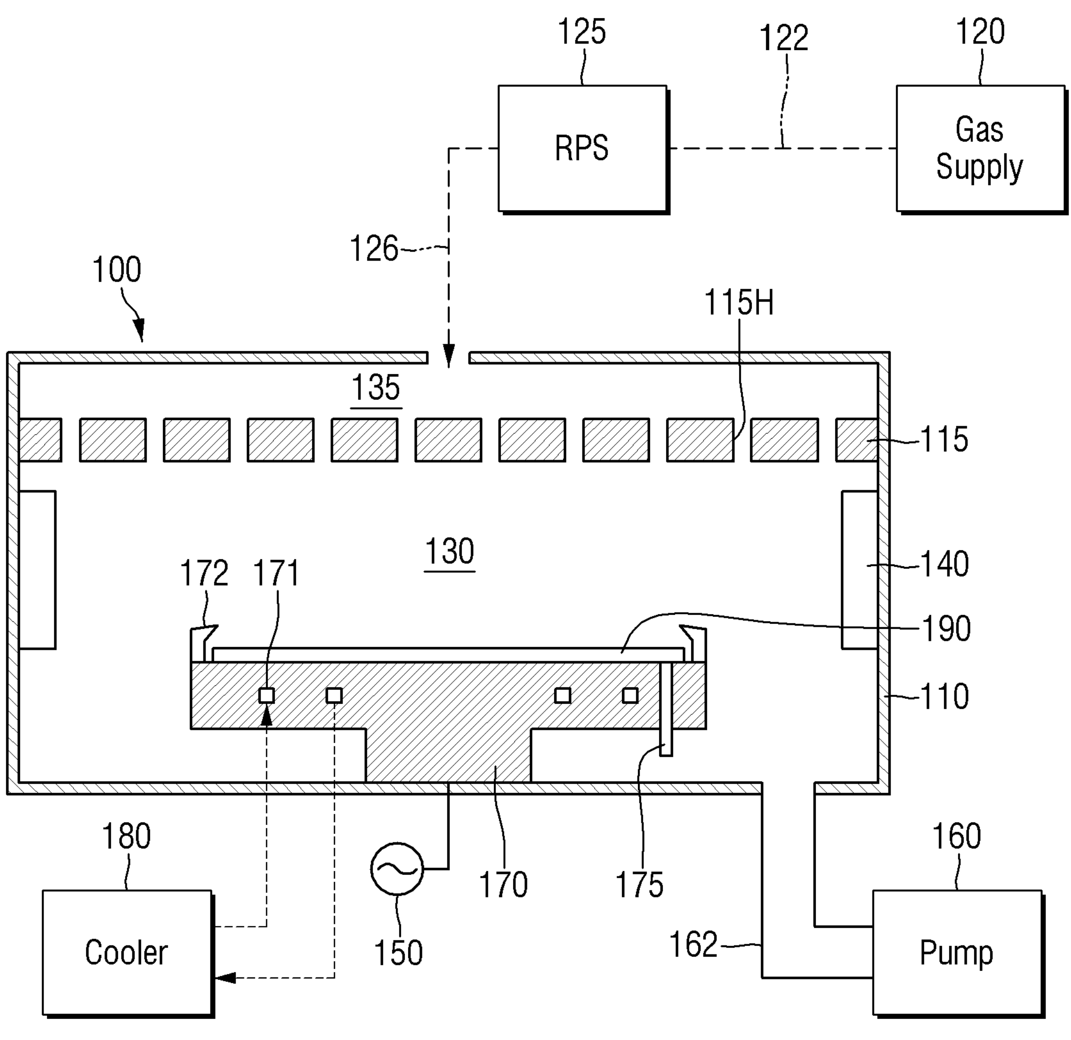
FIG. 1 is a schematic cross-sectional view illustrating a substrate treatment apparatus according to some embodiments.

Hereinafter, a substrate treatment apparatus according to some embodiments will be described with reference to FIGS. 1 and 2. FIG. 1 is a schematic cross-sectional view illustrating a substrate treatment apparatus according to some embodiments.

Referring to FIG. 1, the substrate treatment apparatus according to some embodiments may include a process chamber 100, a gas supply 120 and a remote plasma supply (RPS) 125.

The process chamber 100 may be a chamber for processing a substrate 190 by using plasma. For example, the process chamber 100 may be a chamber for performing a semiconductor process such as a deposition process, an etching process and a cleaning process on the substrate 190. The name of the substrate treatment apparatus may be subdivided depending on functions of the process chamber 100.

In some embodiments, the process chamber 100 may be a deposition chamber. A deposition process may be performed inside the process chamber 100. The deposition process may be, for example, a chemical vapor deposition (CVD) method and an atomic layer deposition (ALD) method. In accordance with one embodiment, the deposition process, the etching process, and the cleaning process may be performed together in the process chamber 100.

In the present disclosure, the term "substrate" may mean a substrate itself, or a stacked structure that includes a substrate and a predetermined layer or film formed on a surface of the substrate. Also, the "surface of the substrate" may mean an exposed surface of the substrate itself or an exposed surface of a predetermined layer or film formed on the substrate. For example, the substrate may be a wafer, or may include a wafer and at least one material layer on the wafer. The material layer may be an insulating layer and/or a conductive layer formed on the wafer through various methods such as deposition, coating plating, etc. For example, the insulating layer may include an oxide layer, a nitride layer or an oxynitride layer, and the conductive layer may include a metal layer or a polysilicon layer. The material layer may be a single layer formed on the wafer, or a multi-layer. The material layer may be formed on the wafer at a predetermined pattern.

The process chamber 100 may include a housing 110, a shower head 115, and a substrate support unit 170. The housing 110 may include a plasma area 135 in which plasma is generated or a plasma generated from the outside is introduced, and a treatment area 130 in which the substrate 190 is treated.

In more detail, the housing 110 defines an internal space of the process chamber 100, that is, the plasma area 135 and the treatment area 130, wherein the internal space may be sealed from the outside. An overall outer structure of the housing 110 may have a cylindrical shape, an elliptical pillar shape or a polygonal pillar shape. The housing 110 may be formed of a metal material, and may maintain an electrical ground state in order to block noise from the outside during a plasma process.

Although not shown, a liner may be provided inside the housing 110. The liner protects the housing 110 and covers metal structures in the housing 110 to avoid occurrence of metal contamination caused by arcing in the process chamber 100. The liner may be formed of a metal material such as aluminum or a ceramic material. The liner may be formed of a material layer that is resistant to plasma in the plasma area 135. In this case, the material layer resistant to plasma may be, for example, an yttrium oxide ($Y_2O_3$) layer. Of course, the material layer resistance to plasma is not limited to the yttrium oxide layer.

The housing 110 may be connected to a pump 160 through a discharge pipe 162. By-products generated after the plasma process may be discharged through the exhaust pipe 162 using the pump 160. In addition, the pump 160 may serve to control a pressure inside the process chamber 100 or a pressure inside the housing 110.

In some embodiments, the pressure inside the housing 110 may be 0.2 torr to 5.0 torr. Preferably, the pressure inside the housing 110 may be 0.5 torr to about 2.0 torr. When the pressure inside the housing 110 is 0.2 torr or more and 5.0 torr or less, efficiency of the substrate treatment apparatus according to some embodiments may be further improved. This will be described later in detail with reference to FIG. 9.

A membrane material 140 may be deposited on an inner wall of the housing 110. The membrane material 140 may be a by-product generated after the deposition process is performed on the substrate 190. For example, when a deposition process of depositing tungsten (W) on the substrate 190 is performed using the substrate treatment apparatus, the membrane material 140 may include tungsten. The membrane material 140 may include, for example, at least one of tungsten, tungsten nitride, silicon dioxide, titanium or titanium nitride. The membrane material 140 may be a membrane material that may be deposited by a chemical vapor deposition (CVD) and an atomic layer deposition (ALD) method. Although the membrane material 140 is illustrated as being deposited on the inner wall of the housing 110, it is not limited thereto. The membrane material 140 may be disposed inside the process chamber 100.

The shower head 115 may be installed in the housing 110. The shower head 115 may include a plurality of holes 115H through which gas may flow. The plasma supplied from the outside of the housing 110 may be supplied to the treatment area 130 through the holes 115H of the shower head 115.

The gas supply 120 may be installed outside the housing 110. The gas supply 120 may supply process gas to the remote plasma supply 125. The process gas may include, for example, a first process gas and a second process gas. The first process gas may be a source gas for plasma-processing the second process gas, and the second process gas may be a source gas for cleaning the membrane material 140 deposited on the inner wall of the housing 110.

The first process gas may include, for example, argon (Ar), and the second process gas may include a source gas containing fluorine (F). For example, the second process gas may include fluorine ($F_2$), boron trifluoride ($BrF_3$), fluorine trichloride ($ClF_3$), nitrogen trifluoride ($NF_3$), hydrofluoric acid (HF), hexagonal sulfuric acid ($SF_6$) and xenon difluoride ($XeF_2$), or may include fluorocarbon-based ($C_xF_y$) gases such as carbon tetrafluoride ($CF_4$), hexafluoroethane ($C_2F_6$), octafluoropropane ($C_3F_8$) and octafluorocyclobutane ($C_4F_8$), but the type of the second process gas is not limited thereto. The second process gas may be appropriately selected depending on a cleaning target or an etching target. For example, the second process gas may include a source gas containing chlorine (Cl) such as chlorine ($Cl_2$), boron trichloride ($BCl_3$), carbon tetrachloride ($CCl_4$) and silicon tetrachloride ($SiCl_4$), and may include gas containing oxygen (O) components such as oxygen ($O_2$) and ozone ($O_3$). Preferably, the second process gas may include nitrogen trifluoride ($NF_3$).

In some embodiments, a flow rate at which the first process gas is supplied may be 1000 standard cubic centimeters per minute (sccm) and 15000 sccm. Preferably, the flow rate at which the first process gas is supplied may be 1000 sccm to 4000 sccm. More preferably, the flow rate at which the first process gas is supplied may be 3000 sccm to 4000 sccm. More preferably, the flow rate at which the first process gas is supplied may be 3500 sccm. When the flow rate at which the first process gas is supplied is 1000 sccm to 15000 sccm, efficiency of the substrate treatment apparatus according to some embodiments may be improved. This related description will be described in detail with reference to FIG. 5.

The remote plasma supply 125 may be connected to the gas supply 120 through the gas supply line 122. The remote plasma supply 125 may generate a process plasma by applying power to the process gas supplied from the gas supply 120. The power may be applied, for example, as a radio frequency power (RF power) in the form of an electromagnetic wave having a predetermined frequency and intensity. In addition, the power may be applied in the form of a continuous wave or a pulse with an on-off period of an electromagnetic wave form.

For reference, the plasma may include various components such as radicals, ions, electrons, ultraviolet rays, etc. At least one of the components, such as the radicals, ions, electrons, ultraviolet rays, etc., may be used for the treatment process of the substrate 190, e.g., etching, cleaning and deposition processes. Basically, the radicals are electrically neutral, and the ions electrically have a polarity. Therefore, the radicals may be used to isotropically remove a washing target during a cleaning process using plasma or to isotropically remove an etching target during an etching process using plasma. The radicals may also be used to disturb or inhibit the deposition of certain components during the deposition process. The ions may be used when the cleaning target is anisotropically removed during the cleaning process, or may be used when the etching target is anisotropically removed during the etching process.

The remote plasma supply 125 may generate a first supply plasma by plasma-processing the first supply gas supplied from the gas supply 120. When the first supply gas is argon (Ar) gas, the first supply plasma may be an argon (Ar) plasma. The remote plasma supply 125 may generate a second supply plasma by plasma-processing the second supply gas supplied from the gas supply 120. When the second supply gas is a nitrogen trifluoride ($NF_3$) gas, the second supply plasma may be a nitrogen trifluoride ($NF_3$) plasma.

In some embodiments, the second supply plasma may be generated using the first supply plasma. For example, the first supply gas may be plasma-processed to generate the first supply plasma and electrons. The second supply plasma may be generated by reaction of the electrons and the second supply gas.

The remote plasma supply 125 may supply the first supply plasma and the second supply plasma to the process chamber 100 or the inside of the housing 110 through the plasma supply line 126. First, the remote plasma supply 125 may supply the first process plasma and the second process plasma to the plasma area 135. Then, the first process plasma and the second process plasma may be supplied to the treatment area 130 through the shower head 115. The first process plasma and the second process plasma may be supplied to the treatment area 130 through the plurality of holes 115H of the shower head 115.

In some embodiments, the substrate support unit 170 may be installed inside the housing 110. The substrate support unit 170 may be disposed below the treatment area 130 of the process chamber 100. The substrate support unit 170 may support the substrate 190.

The substrate support unit 170 may include an electrostatic chuck configured to support the substrate 190 with an electro-static force and a chuck support for supporting the electrostatic chuck. The electrostatic chuck may include an electrode for chucking and dechucking of the substrate 190 therein. The chuck support may support the electrostatic chuck disposed thereon, and may be formed of a metal such as aluminum or a ceramic insulator such as alumina. A heating member, such as a heater, may be disposed inside the chuck support, and heat from the heater may be transferred to the electrostatic chuck or substrate 190. In addition, a power applying line connected to the electrode of the electrostatic chuck may be disposed on the chuck support. Of course, the configuration of the substrate support unit 170 is not limited to the above example, and the substrate support unit 170 may include a vacuum chuck configured to support the substrate 190 by using vacuum, or may be configured to mechanically support the substrate 190.

The substrate support unit 170 may include a lift pin 175. The lift pin 175 may be configured to lift the substrate 190 from a surface of the substrate support unit 170 on which the substrate 190 is seated. The lift pin 175 may be accommodated in holes provided in the substrate support unit 170. The lift pin 175 may be movably installed in a vertical direction with respect to the substrate support unit 170. The lift pin 175 may move in a vertical direction to ascend and descend the substrate 190. The substrate support unit 170 may include a number of lift pins 175 suitable for supporting the substrate 190. For example, the substrate support unit 170 may include, but is not limited to, three or more lift pins 175 equally spaced apart from one another along a circumferential direction of the substrate support unit 170.

The lift pin 175 may be in a pin-up state protruded upward from the substrate support unit 170 to support the substrate 190 when the substrate 190 which is a target to be treated is loaded into the process chamber 100 or the substrate 190 is unloaded from the process chamber 100. Further, while the substrate 190 is being treated in the process chamber 100, the lift pin 175 may be in a pin-down state that is lowered below an upper surface of the substrate support unit 170 so that the substrate 190 is placed on the substrate support unit 170.

An RF bias source 150 may be connected to the substrate support unit 170. The RF bias source 150 may apply RF power to the substrate support unit 170. In some embodiments, the RF bias source 150 may apply RF power of a low frequency less than about 200 kHz to the substrate support unit 170 during a cleaning process, a deposition process or an etching process on the substrate 190. In some embodiments, the RF bias source 150 may remove the RF power supplied to the substrate support unit 170 during the cleaning process, the deposition process or the etching process on the substrate 190.

In some embodiments, the substrate support unit 170 may further include a cooling channel 171 and a rim 172.

The cooling channel 171 may be connected to a cooler 180. The cooler 180 may cool the substrate support unit 170.

The cooler 180 may supply a cooling fluid to the cooling channel 171 of the substrate support unit 170. The cooling channel 171 of the substrate support unit 170 is a passage through which the cooling fluid may flow, and may have a concentrical or helical pipe shape based on a central axis of the substrate support unit 170. The cooler 180 may adjust a temperature, a flow rate and a flow velocity of the cooling fluid supplied to the cooling channel 171 of the substrate support unit 170, thereby adjusting a temperature of the substrate support unit 170 and a temperature of the substrate 190 mounted on the substrate support unit 170.

The cooling fluid may include a material operable in a wide temperature range. For example, the cooling fluid may include water, ethylene glycol, silicone oil, liquid Teflon or a mixture thereof. The cooler 180 may adjust the temperature of the cooling fluid to a cryogenic temperature range. Alternatively, the cooler 180 may adjust the temperature of the cooling fluid to a room temperature.

The rim 172 may be provided on the substrate support unit 170. The rim 172 may surround the substrate 190 placed on the substrate support unit 170. The rim 172 may prevent the substrate 190 from slipping on the substrate support unit 170. The rim 172 may include a ceramic material. Since the rim 172 includes a ceramic material, the rim 172 may be vulnerable to reaction stress.

Although not shown, the substrate treatment apparatus according to some embodiments may include a controller for controlling a substrate treatment process using the substrate treatment apparatus.

The controller may be a computing device such as a workstation computer, a desktop computer, a laptop computer, and a tablet computer. The controller may be a processor, a microprocessor, a central processing unit (CPU) or firmware. The controller may be implemented by specific hardware such as, for example, a general purpose computer or a Digital Signal Processor (DSP), a Field Programmable Gate Array (FPGA) and an Application Specific Integrated Circuit (ASIC).

The operation of the controller may be implemented by commands stored on a machine-readable medium that may be read and executed by one or more processors. In this case, the machine-readable medium may include a random mechanism for storing and/or transmitting information in a form readable by a machine (e.g., computing device). For example, the machine-readable medium may include a read-only memory (ROM), a random access memory (RAM), a magnetic disk storage medium, an optical storage medium, and flash memory devices.

Figure 2:
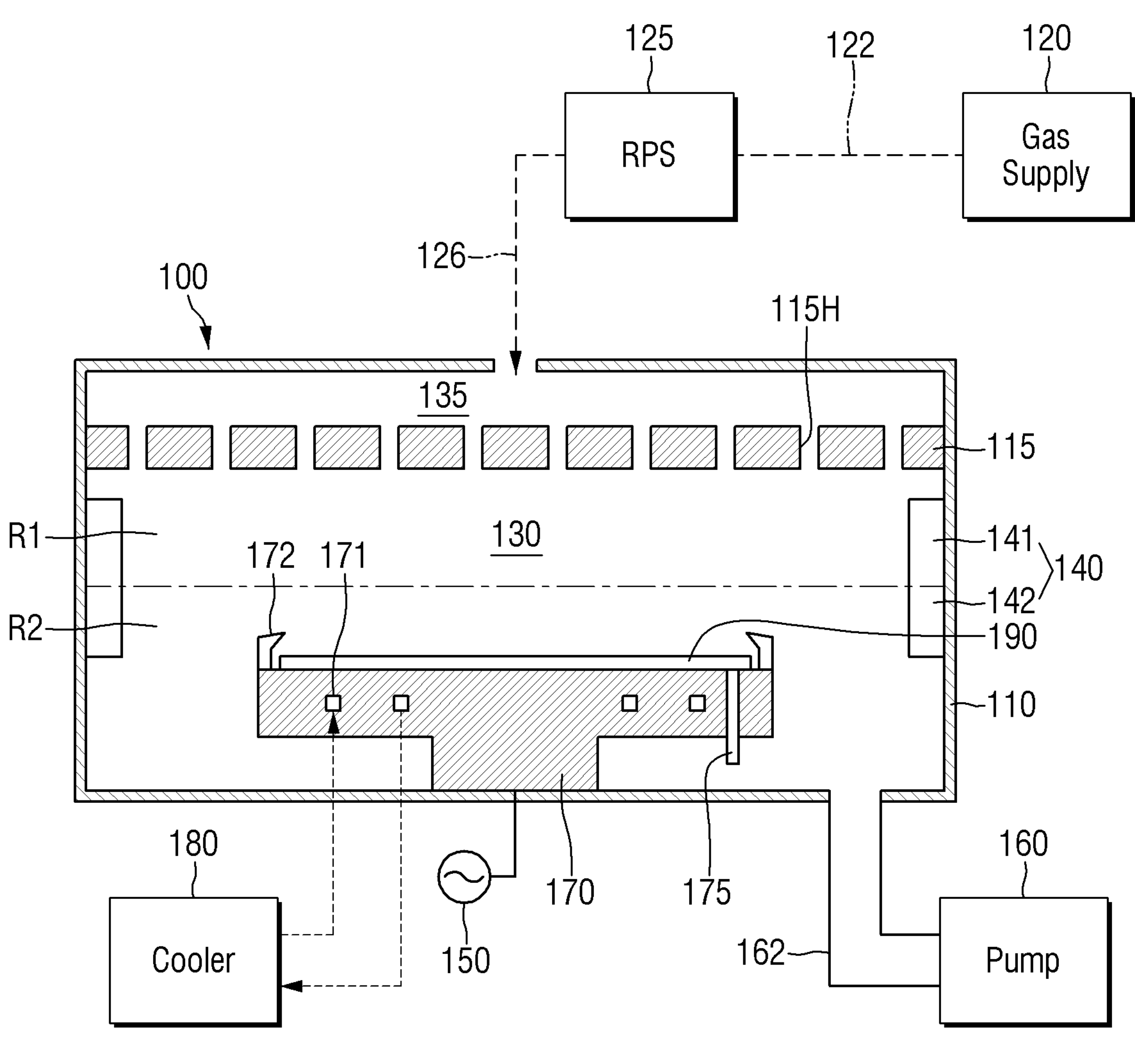
FIG. 2 is a view illustrating a substrate treatment apparatus according to some embodiments.

FIG. 2 is a view illustrating a substrate treatment apparatus according to some embodiments. For convenience of description, the following description will be based on a difference from the description of FIG. 1.

Referring to FIG. 2, the inside of the process chamber 100 may include a first region R1 and a second region R2. The membrane material 140 may include a first portion 141 and a second portion 142.

The first region R1 may be provided on the second region R2. The second region R2 may be provided below the first region R1. The first region R1 may be a region where the plasma inside the housing 110 cleans the membrane material 140 when the pressure inside the process chamber 100 is a first pressure. The second region R2 may be a region where the plasma inside the housing 110 cleans the membrane material 140 when the pressure inside the process chamber 100 is a second pressure. The first pressure may be greater than the second pressure.

When the pressure inside the process chamber 100 is high, the intermolecular distance is relatively decreased. In this case, the possibility of intermolecular collision may be increased. On the other hand, when the pressure inside the process chamber 100 is low, the intermolecular distance is relatively increased. In this case, the possibility of intermolecular collisions may be reduced. When the possibility of intermolecular collisions is increased, there is a low probability that molecules with sufficient energy are provided to the lower region of the process chamber 100, such as the second region R2. When the possibility of intermolecular collisions is reduced, there is a high probability that molecules with sufficient energy are provided to the lower region of the process chamber 100, such as the second region R2. Accordingly, when the pressure inside the process chamber 100 is the first pressure, more molecules having sufficient energy may be provided to the first region R1 than to the second region R2. When the pressure inside the process chamber 100 is the second pressure, more molecules having sufficient energy may be provided to the second region R2 than to the first region R1

In some embodiments, the first pressure is greater than the second pressure. The first portion 141 of the membrane material 140 is provided in the first region R1. The second portion 142 of the membrane material 140 is provided in the second region R2. For example, when the pressure inside the housing 110 is the first pressure, the plasma inside the housing 110 may clean the first portion 141 of the membrane material 140. When the pressure inside the housing 110 is the second pressure, the plasma inside the housing 110 may clean the second portion 142 of the membrane material 140. However, the technical aspects of the present disclosure are not limited to the above example.

In some embodiments, the first pressure may be 1.0 torr to 5.0 torr, and the second pressure may be 0.2 torr to 1.0 torr. More preferably, the first pressure may be 2.0 torr and the second pressure may be 0.5 torr, but these pressures are not limited thereto.

Hereinafter, a substrate treatment method using a substrate treatment apparatus according to some embodiments will be described with reference to FIGS. 3 to 11.

Figure 3:
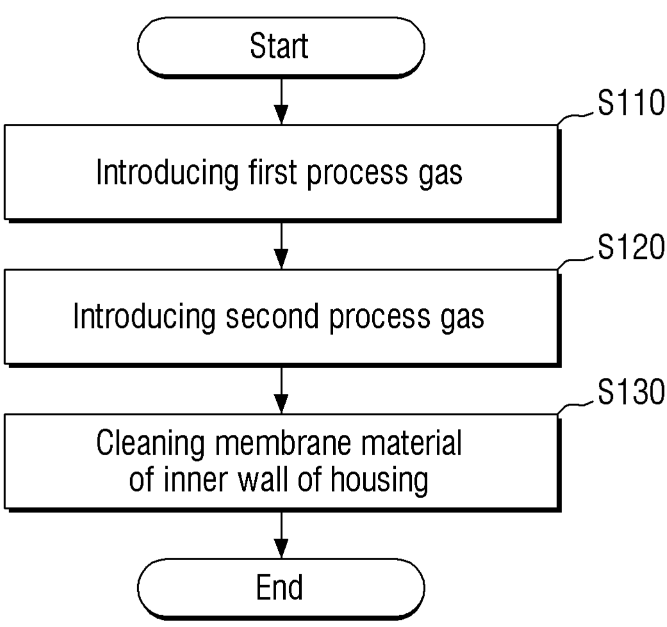
FIG. 3 is an exemplary flow chart illustrating a substrate treatment method using a substrate treatment apparatus according to some embodiments.
Figure 4:
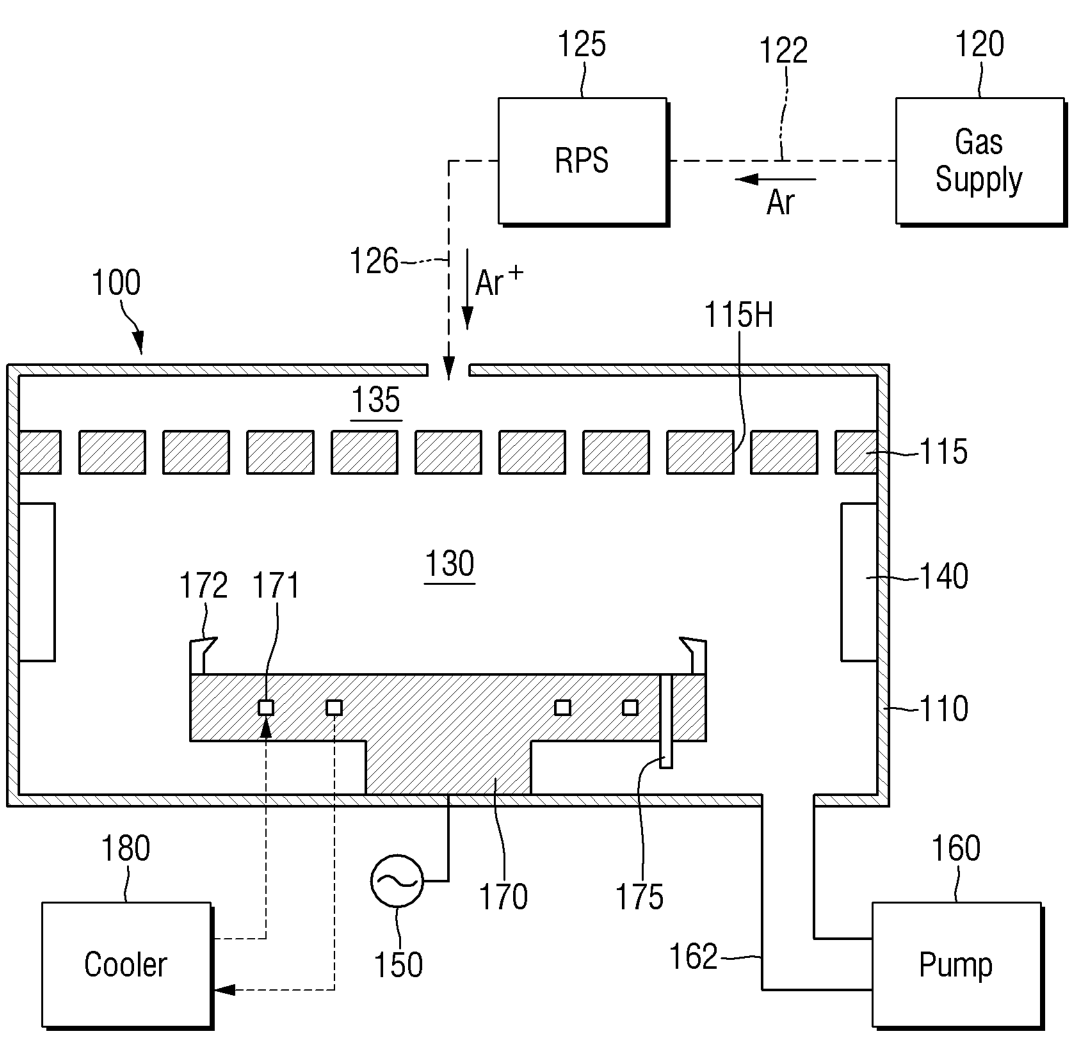
FIG. 4 is a view illustrating S110 of FIG. 3.
Figure 5:
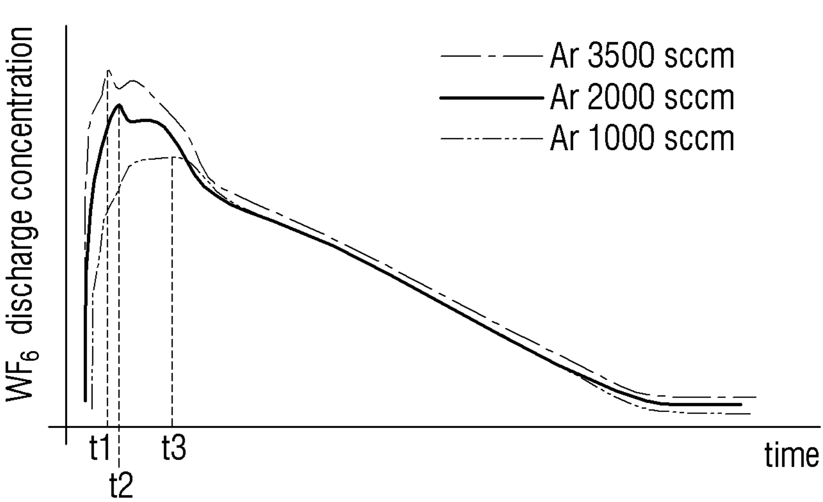
FIG. 5 is an exemplary graph illustrating efficiency of the substrate treatment apparatus according to the flow rate at which the first process gas is supplied.

FIG. 3 is an exemplary flow chart illustrating a substrate treatment method using a substrate treatment apparatus according to some embodiments. FIG. 4 is a view illustrating S110 of FIG. 3. FIG. 5 is an exemplary graph illustrating efficiency of the substrate treatment apparatus according to the flow rate at which the first process gas is supplied.

For convenience of description, the first process gas includes argon (Ar) gas, the second process gas includes nitrogen trifluoride ($NF_3$) and the membrane material 140 includes tungsten (W).

Referring to FIGS. 3 and 4, the substrate treatment method according to some embodiments may include introducing the first process gas (S110).

For example, the argon (Ar) gas may be introduced. The argon (Ar) gas may be supplied from the gas supply 120, and then may flow to the remote plasma supply 125 through the gas supply line 122. The remote plasma supply 125 may form an argon (Ar) plasma by plasma-processing the argon (Ar) gas using the following Reaction formula 1.

$$Ar \rightarrow Ar^{+} + e^{-} \qquad \text{Reaction formula 1}$$

That is, the remote plasma supply 125 may generate argon ions (Art) and electrons (e) by using the argon (Ar) gas. The argon ions (Art) may be supplied into the inside of the housing 110 or the inside of the process chamber 100 through the plasma supply line 126.

In some embodiments, a flow rate of the argon (Ar) gas may be 1000 sccm to 15000 sccm. Preferably, the flow rate of the argon (Ar) gas may be 1000 sccm to 4000 sccm. More preferably, the flow rate of the argon (Ar) gas may be 3000 sccm to 4000 sccm. More preferably, the flow rate of the argon (Ar) gas may be 3500 sccm.

When the membrane material 140 includes tungsten (W), the by-product generated in the process of cleaning the membrane material 140 may be tungsten hexafluoride ($WF_6$). Therefore, the faster a discharge rate of the tungsten hexafluoride ($WF_6$) is, the better efficiency of the substrate treatment apparatus is.

Referring to FIG. 5, it is noted that the greater the flow rate of the argon (Ar) gas is, the higher efficiency of the substrate treatment apparatus is. For reference, in FIG. 5, an x-axis is the time at which the substrate treatment process is performed, and a y-axis represents a discharge concentration of tungsten hexafluoride ($WF_6$). Therefore, a slope of the graph of FIG. 5 may be a discharge rate of the tungsten hexafluoride ($WF_6$) according to time.

In FIG. 5, a third time t3 is the time when the discharge concentration of the tungsten hexafluoride ($WF_6$) is maximum in a state in which the flow rate of the argon (Ar) gas is 1000 sccm. A second time t2 is the time when the discharge concentration of the tungsten hexafluoride ($WF_6$) is maximum in a state that the flow rate of the argon (Ar) gas is 2000 sccm. A first time t1 is the time when the discharge concentration of the tungsten hexafluoride ($WF_6$) is maximum in a state that the flow rate of the argon (Ar) gas is 3500 sccm.

The first time t1 may be, for example, 141 seconds, the second time t2 may be, for example, 150 seconds, and the third time t3 may be, for example, 167 seconds. In summary, when the flow rate of the supplied argon (Ar) gas is 3500 sccm, the time when the discharge concentration of the tungsten hexafluoride ($WF_6$) is maximum may be shorter than the case that the flow rate of the supplied argon (Ar) gas is 2000 sccm. Likewise, when the flow rate of the supplied argon (Ar) gas is 2000 sccm, the time when the discharge concentration of the tungsten hexafluoride ($WF_6$) is maximum may be shorter than the case that the flow rate of the supplied argon (Ar) gas is 1000 sccm.

In addition, as the flow rate of the supplied argon (Ar) gas is increased, the maximum discharge concentration of the tungsten hexafluoride ($WF_6$) may be increased. That is, as the flow rate of the supplied argon (Ar) gas is increased, the discharge rate of the tungsten hexafluoride ($WF_6$) may be increased. For example, when the flow rate of the supplied argon (Ar) gas is 3500 sccm, the discharge rate of the tungsten hexafluoride ($WF_6$) is faster than the case that the flow rate of the supplied argon (Ar) gas is 2000 sccm. When the flow rate of the argon (Ar) gas is 2000 sccm, the discharge rate of the tungsten hexafluoride ($WF_6$) is faster than the case that the flow rate of the supplied argon (Ar) gas is 1000 sccm.

The higher the flow rate of the supplied argon (Ar) gas is, the discharge amount of the tungsten hexafluoride ($WF_6$) may be increased. That is, as the flow rate of the supplied argon (Ar) gas is increased, efficiency of the substrate treatment apparatus according to some embodiments may be increased.

Figure 6:
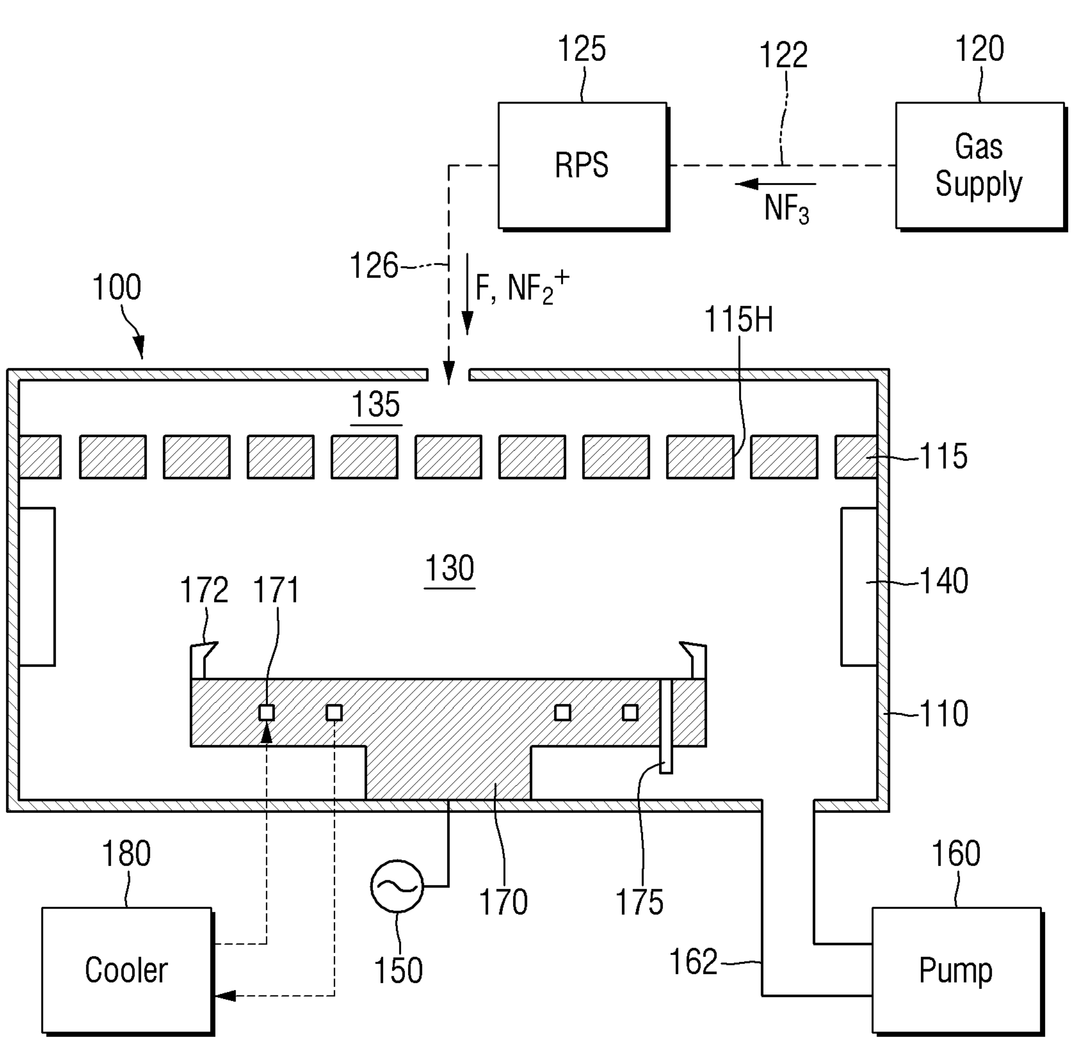
FIG. 6 is a view illustrating S120 of FIG. 3.

FIG. 6 is a view illustrating S120 of FIG. 3.

Referring to FIGS. 3 and 6, the substrate treatment method according to some embodiments may include introducing the second process gas (S120).

In other words, nitrogen trifluoride ($NF_3$) gas may be introduced. The nitrogen trifluoride ($NF_3$) gas may be supplied from the gas supply 120, and then may flow to the remote plasma supply 125 through the gas supply line 122. The remote plasma supply 125 may plasma-process the nitrogen trifluoride ($NF_3$) gas by using the following Reaction formula 2 to form a nitrogen trifluoride ($NF_3$) plasma.

$$NF_3+e^-\rightarrow NF_2^++2e^-+F \qquad \text{Reaction formula 2}$$

That is, the remote plasma supply 125 may generate nitrogen trifluoride ions ($NF_2$+), electrons (e) and fluorine (F) using nitrogen trifluoride ($NF_3$) gas. For example, nitrogen trifluoride ($NF_3$) may react with electrons (e) generated from the argon (Ar) gas to generate nitrogen trifluoride ions ($NF_2$+) and fluorine (F). The generated nitrogen trifluoride ions ($NF_2$+) and fluorine (F) may be supplied to the inside of the process chamber 100 or the inside of the housing 110 through the plasma supply line 126.

Figure 7:
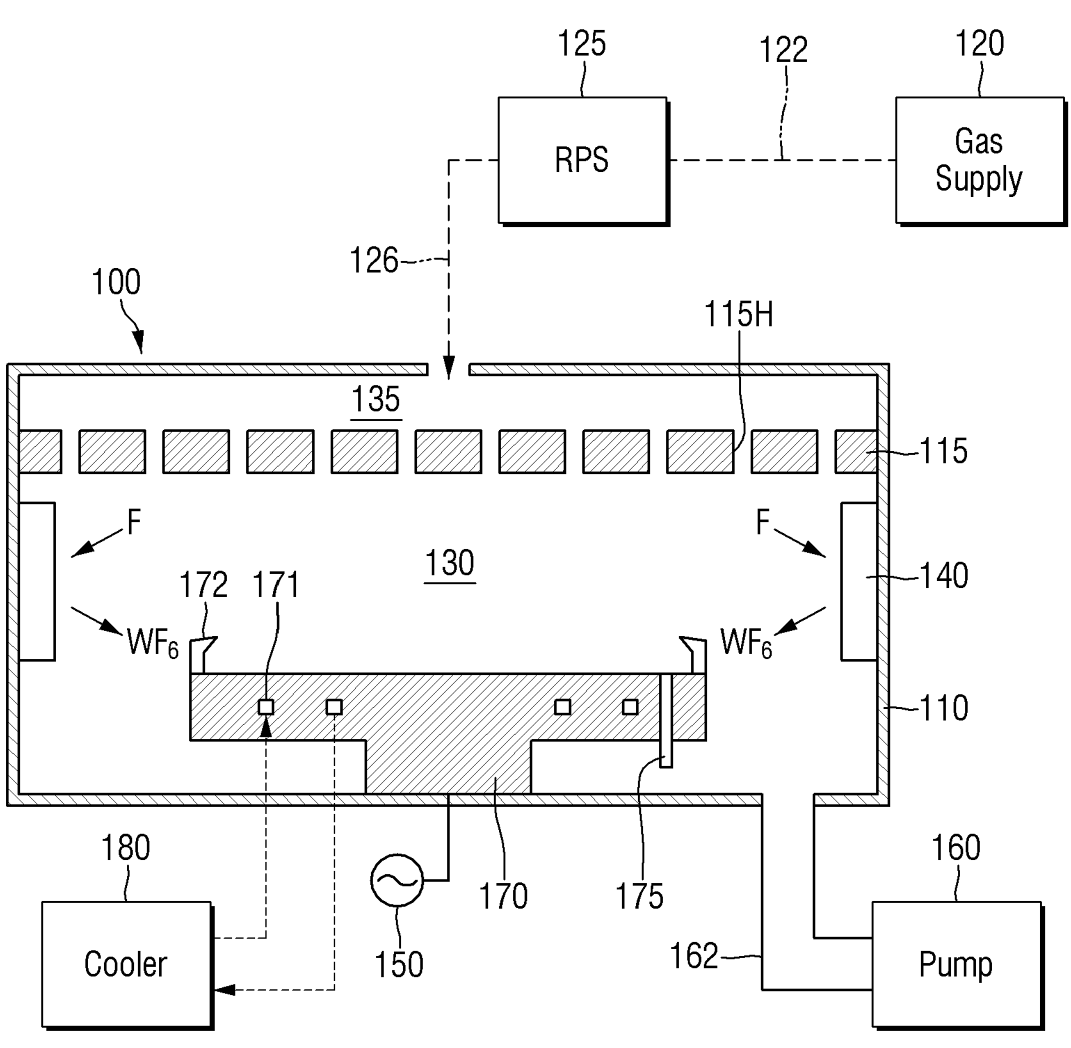
FIG. 7 is a view illustrating S130 of FIG. 3.
Figure 8:
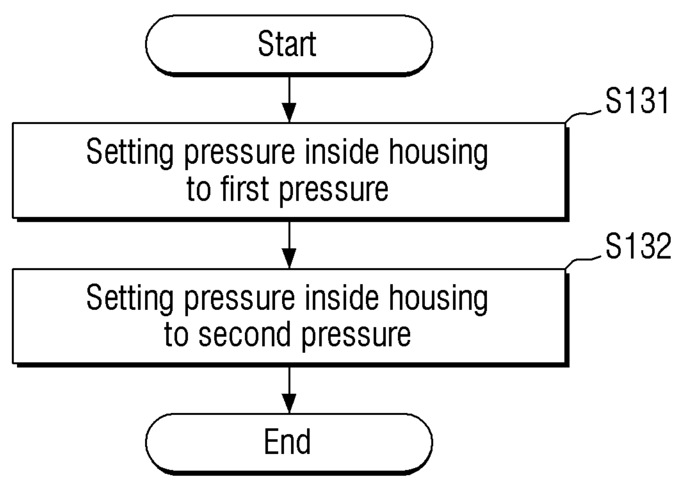
FIG. 8 is a flow chart illustrating S130 of FIG. 3.
Figure 9:
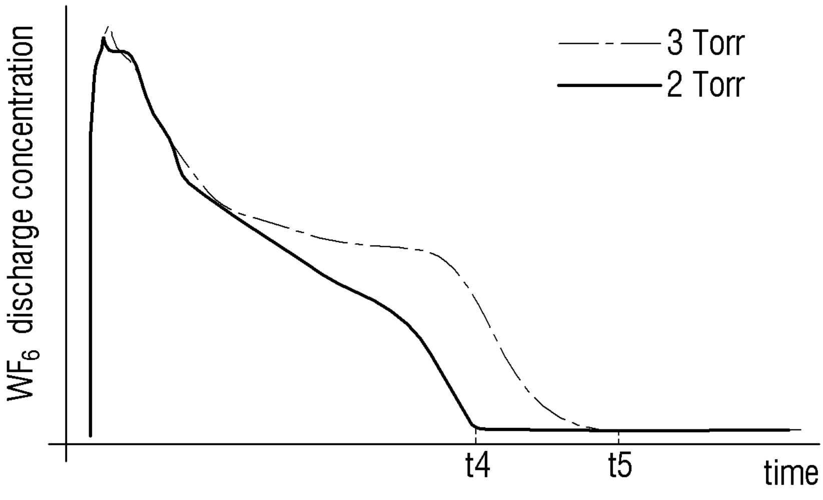
FIG. 9 is an exemplary graph illustrating efficiency of the substrate treatment apparatus according to the pressure inside the process chamber.

FIG. 7 is a view illustrating S130 of FIG. 3. FIG. 8 is a flow chart illustrating S130 of FIG. 3. FIG. 9 is an exemplary graph illustrating efficiency of the substrate treatment apparatus according to the pressure inside the process chamber.

Referring first to FIGS. 3 and 7, the substrate treatment method according to some embodiments may include cleaning a membrane material of an inner wall of the housing (S130).

The membrane material 140 of the inner wall of the housing 110 may be cleaned using fluorine (F) atoms introduced into the housing 110. For example, the membrane material 140 may be cleaned using the following Reaction formula 3.

$$W+6F\rightarrow 6WF_6 \qquad \text{Reaction formula 3}$$

That is, tungsten (W) contained in the membrane material 140 may react with fluorine (F) inside the housing 110 to form tungsten hexafluoride ($WF_6$). The tungsten hexafluoride ($WF_6$) may be a by-product generated after the membrane material 140 is cleaned.

Referring to FIG. 8, cleaning the membrane material 140 of the inner wall of the housing 110 may include setting the pressure inside the housing 110 to a first pressure (S131) and setting the pressure of the inner wall of the housing to a second pressure (S132).

Cleaning the membrane material 140 of the inner wall of the housing 110 may include at least two steps. For example, in a first step, the pressure inside the housing 110 may be set to the first pressure. In a second step, the pressure inside the housing 110 may be set to the second pressure. The first pressure may be greater than the second pressure. For example, the first pressure may be 1.0 torr to 5.0 torr, and the second pressure may be 0.2 torr to 1.0 torr. Preferably, the first pressure may be 2.0 torr, and the second pressure may be 0.5 torr. For convenience of description, the first pressure is 2.0 torr and the second pressure is 0.5 torr.

In some embodiments, the first step may be performed prior to the second step. In other words, the pressure inside the housing 110 may be reduced from the first pressure to the second pressure. For example, the pressure inside the housing 110 may be reduced from 2.0 torr to 0.5 torr.

The pressure inside the housing 110 may be adjusted using the pump 160. When the pressure inside the housing 110 is too low, performance of the substrate support unit 170 may be deteriorated. Therefore, the cleaning process may be performed at a first pressure, for example, 2.0 torr, which is a relatively high pressure, and then may be performed at a second pressure, for example, 0.5 torr, which is a relatively low pressure.

In some embodiments, in the first step, cleaning the membrane material 140 of the inner wall of the housing 110 may be performed for a time of about 800 seconds to 2900 seconds or less. The time of about 800 seconds to 2900 seconds or less may be the time required to protect the rim 172 of the substrate support unit 170.

For example, the rim 172 of the substrate support unit 170 may be formed of a ceramic material. Since the rim 172 includes a ceramic material, the rim 172 may be vulnerable to reaction stress. Therefore, after the pressure inside the housing 110 is set to a first pressure, for example, 2.0 torr, the cleaning process may be performed. Subsequently, after the pressure inside the housing 110 may be set to the second pressure lower than the first pressure, for example, 0.5 torr, the cleaning process may be performed to protect the rim 172.

In more detail, the membrane material 140 may also be deposited on the rim 172. It is necessary to maintain the pressure inside the housing 110 to be high until the reaction of the membrane material 140 deposited on the rim 172 is stabilized. Therefore, in some embodiments, the pressure inside the housing 110 may be maintained at the first pressure, for example, 2.0 torr until the reaction of the membrane material 140 deposited on the rim 172 is stabilized, and then the pressure inside the housing 110 may be lowered to the second pressure, for example, 0.5 torr. In this case, in the first step, the time at which the pressure inside the housing 110 is maintained at the first pressure may be about 800 seconds to 2900 seconds or less. However, the technical aspects of the present disclosure are not limited to the above example.

Referring to FIG. 9, it is noted that the lower the pressure inside the housing 110 is, the higher efficiency of the substrate treatment apparatus is. For reference, in FIG. 9, an x-axis is the time at which the substrate treatment process is performed, and a y-axis represents a discharge concentration of tungsten hexafluoride ($WF_6$). Therefore, the time at which the concentration of the tungsten hexafluoride ($WF_6$) is 0 may be a cleaning rate of the substrate treatment process.

In FIG. 9, a fourth time t4 may be the time when the concentration of the tungsten hexafluoride ($WF_6$) becomes 0 in a state that the pressure inside the housing 110 is 2.0 torr. A fifth time t5 may be the time when the concentration of the tungsten hexafluoride ($WF_6$) becomes 0 in a state that the pressure inside the housing 110 is 3.0 torr.

In some embodiments, the fourth time t4 is shorter than the fifth time t5. For example, the fourth time t4 may be 52 minutes, and the fifth time t5 may be 66 minutes. That is, when the pressure inside the housing 110 is 2.0 torr, the cleaning rate is faster than that when the pressure inside the housing 110 is 3.0 torr.

In some embodiments, a first cleaning rate for cleaning the membrane material 140 deposited on the inner wall of the housing 110 in the first step is slower than a second cleaning rate required to clean the membrane material 140 deposited on the inner wall of the housing 110 in the second step. That is, when the pressure is high, the cleaning rate of the membrane material 140 is slower than that of the membrane material 140 when the pressure is low. A ratio of the first cleaning rate and the second cleaning rate may be, for example, 1:1.2, but is not limited thereto.

Figure 10:
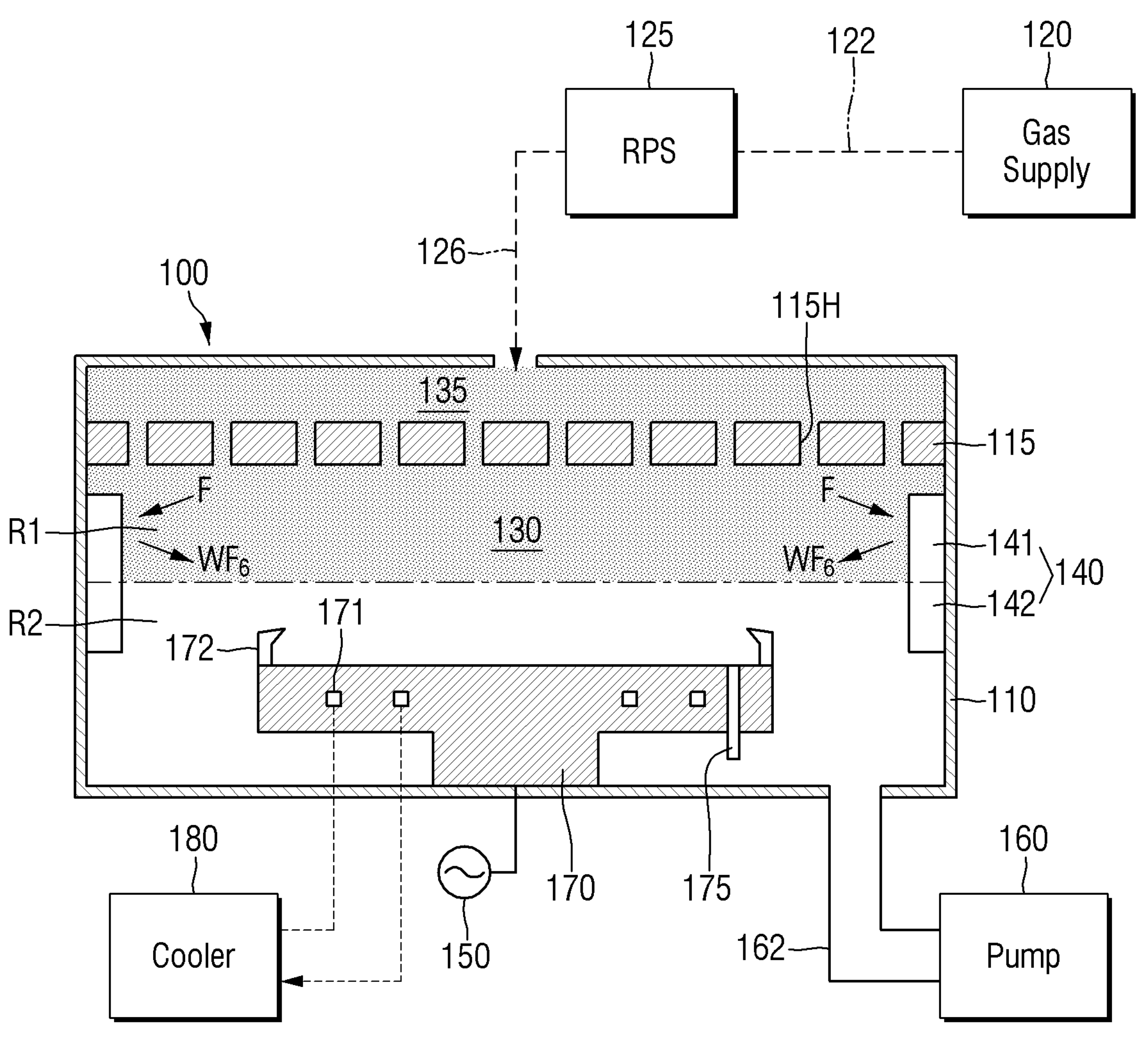
FIGS. 10 and 11 are views illustrating a substrate treatment method according to some embodiments.
Figure 11:
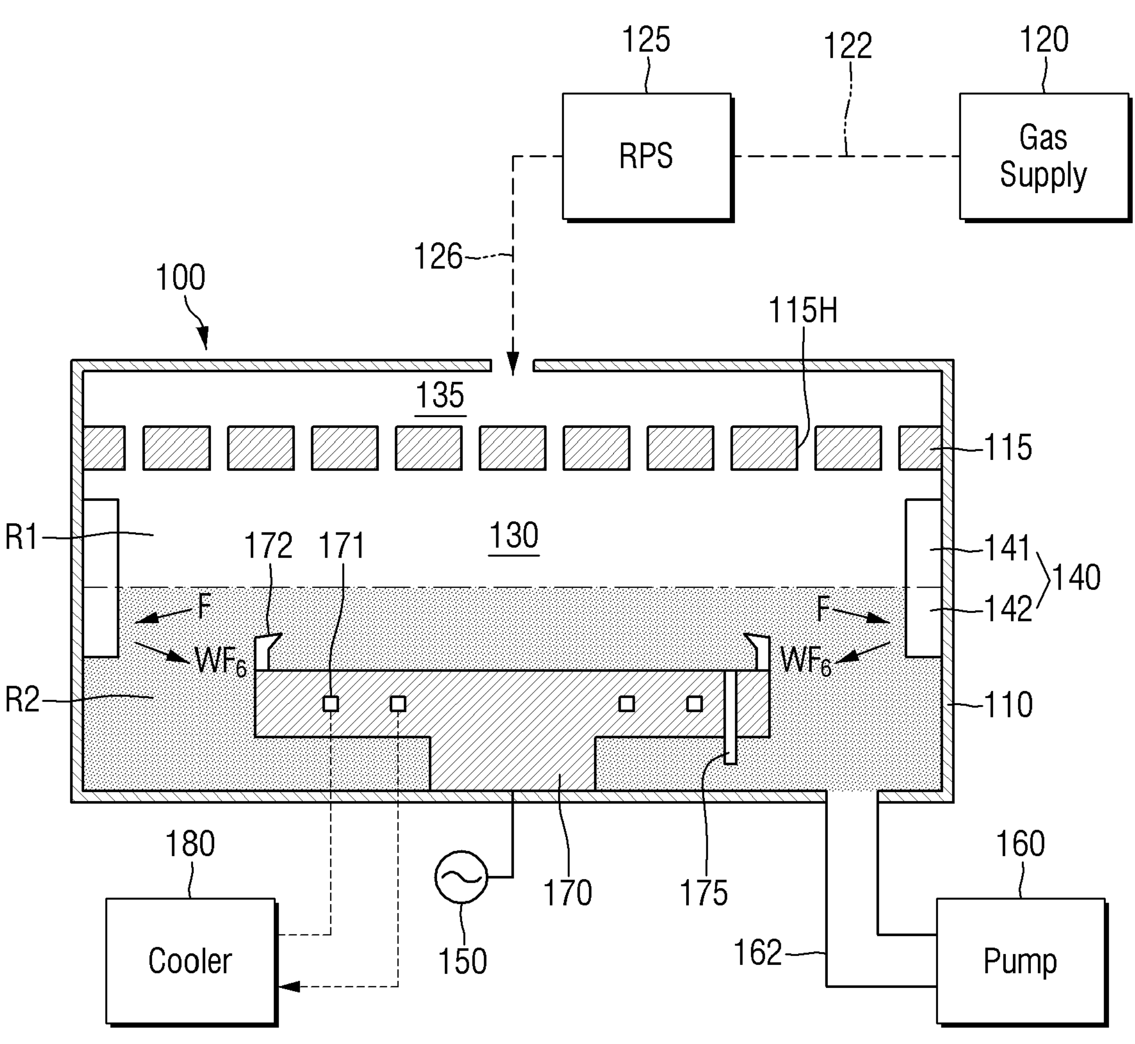

FIGS. 10 and 11 are views illustrating a substrate treatment method according to some embodiments. For convenience of description, the same description as that described with reference to FIGS. 7 to 9 will be omitted.

Referring to FIGS. 10 and 11, the inside of the process chamber 100 or the inside of the housing 110 may include a first region R1 and a second region R2. The first region R1 may be provided on the second region R2. The membrane material 140 may include a first portion 141 and a second portion 142. The first portion 141 of the membrane material 140 is disposed in the first region R1, and the second portion 142 of the membrane material 140 is disposed in the second region R2.

In some embodiments, cleaning the membrane 140 of the inner wall of the housing 110 may include a first step and a second step. The pressure inside the housing 110 may be a first pressure, and the pressure inside the housing 110 in the second step may be a second pressure. The first pressure may be greater than the second pressure.

FIG. 10 is a view illustrating a cleaning process for cleaning the first portion 141 of the membrane material 140 in the first step. When the pressure inside the housing 110 is high, the membrane material 140 in the first region R1 may be cleaned. That is, the first portion 141 of the membrane material 140 may be cleaned.

FIG. 11 is a view illustrating a cleaning process for cleaning the second portion 142 of the membrane material 140 in the second step. When the pressure inside the housing 110 is low, the membrane material 140 in the second region R2 may be cleaned. That is, the second portion 142 of the membrane material 140 may be cleaned. However, the technical aspects of the present disclosure are not limited to this example.

In some embodiments, the flow rate Q of the argon (Ar) gas introduced into the substrate treatment apparatus and the pressure P inside the housing 110 may be adjusted by an experiment planning method. Using the experiment planning method, the following etch rate empirical formula may be obtained.

$$\text{Etch rate}\left(\frac{A}{\min}\right) a\times Q^2 + b\times P\times Q - c\times Q - d\times P + e \quad \text{[Etch rate empirical formula]}$$

In the etch rate empirical formula, the etch rate is the etch rate of the membrane material 140 deposited on the inner wall of the housing 110 or the cleaning rate of the membrane material 140, Q is the flow rate of the Ar gas, and P is the pressure inside the housing 110. Also, a, b, c, d and e are constants, respectively.

Using the etch rate empirical formula, it is noted that the etch rate of the membrane material 140 or the cleaning rate of the membrane material 140 is proportional to the flow rate Q of the argon (Ar) gas and inversely proportional to the pressure P inside the housing 110. Therefore, as the flow rate of the argon (Ar) gas is high, the cleaning rate of the substrate treatment apparatus may be increased. As the pressure inside the housing 110 is low, the cleaning rate of the substrate treatment apparatus may be increased.

For example, the first cleaning rate when the flow rate of the argon (Ar) gas is 3500 sccm and the pressure inside the housing 110 is 2.0 torr may be slower than the second cleaning rate when the flow rate of the argon (Ar) gas is 3500 sccm and the pressure inside the housing 110 is 0.5 torr. For example, a ratio of the first cleaning rate and the second cleaning rate may be 1:1.2, but is not limited thereto.

In some embodiments, constant a may be about 206, constant b may be about 78, constant c may be about 1105, constant d may be about 1187 and constant e may be about 10011, but these values are not limited thereto.

Figure 12:
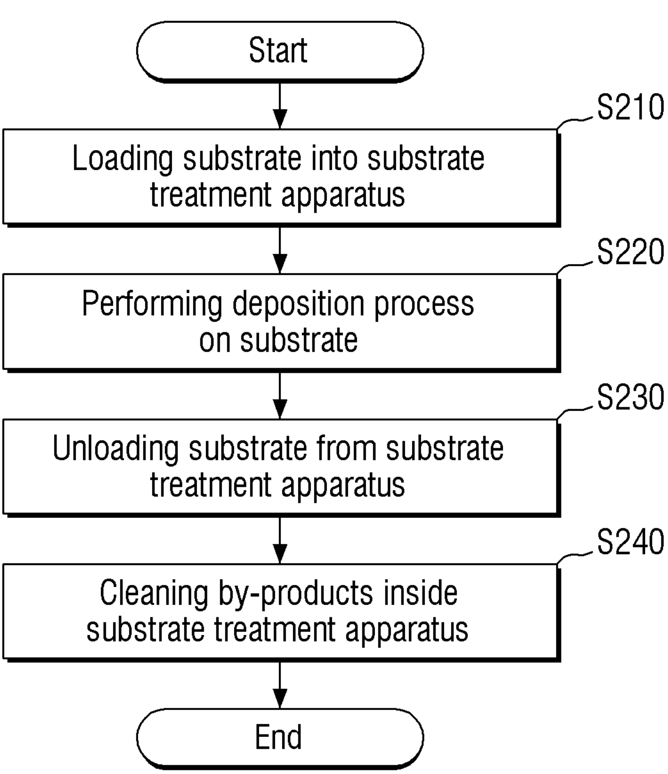
FIG. 12 is an exemplary flow chart illustrating a semiconductor device manufacturing method using a substrate treatment apparatus according to some embodiments.

FIG. 12 is an exemplary flow chart illustrating a semiconductor device manufacturing method using a substrate treatment apparatus according to some embodiments. FIGS.

13 to 15 are views illustrating a semiconductor device manufacturing method according to some embodiments.

Hereinafter, a semiconductor device manufacturing method using a substrate treatment apparatus according to some embodiments will be described with reference to FIGS. 12 to 15.

Figure 13:
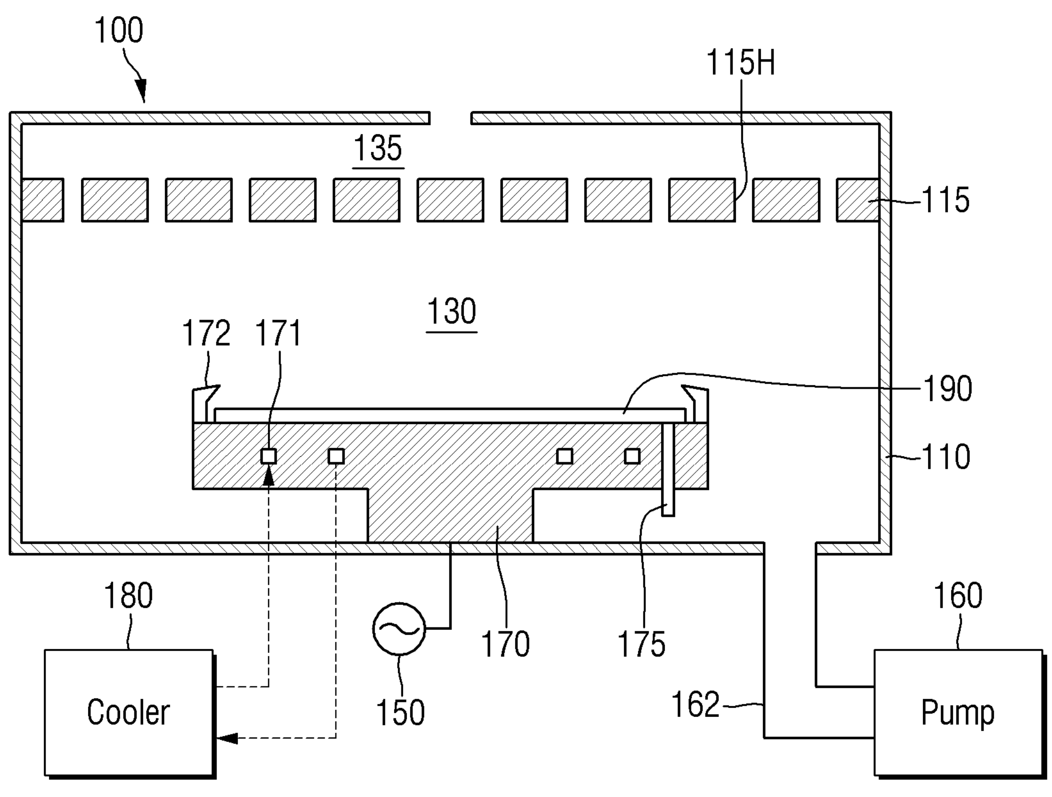
FIGS. 13 to 15 are views illustrating a semiconductor device manufacturing method according to some embodiments.

Referring first to FIGS. 12 and 13, the substrate 190 may be loaded into a substrate treatment apparatus (S210). The substrate 190 may be loaded into the process chamber 100. Once the substrate 190 is loaded into the process chamber 100, the substrate 190 may be placed on the substrate support unit 170. The lift pin 175 of the substrate support unit 170 may lift the substrate 190 in a vertical direction to space the substrate 190 apart from the surface of the substrate support unit 170. The process chamber 100 may be a chamber in which a deposition process is performed, but is not limited thereto.

Figure 14:
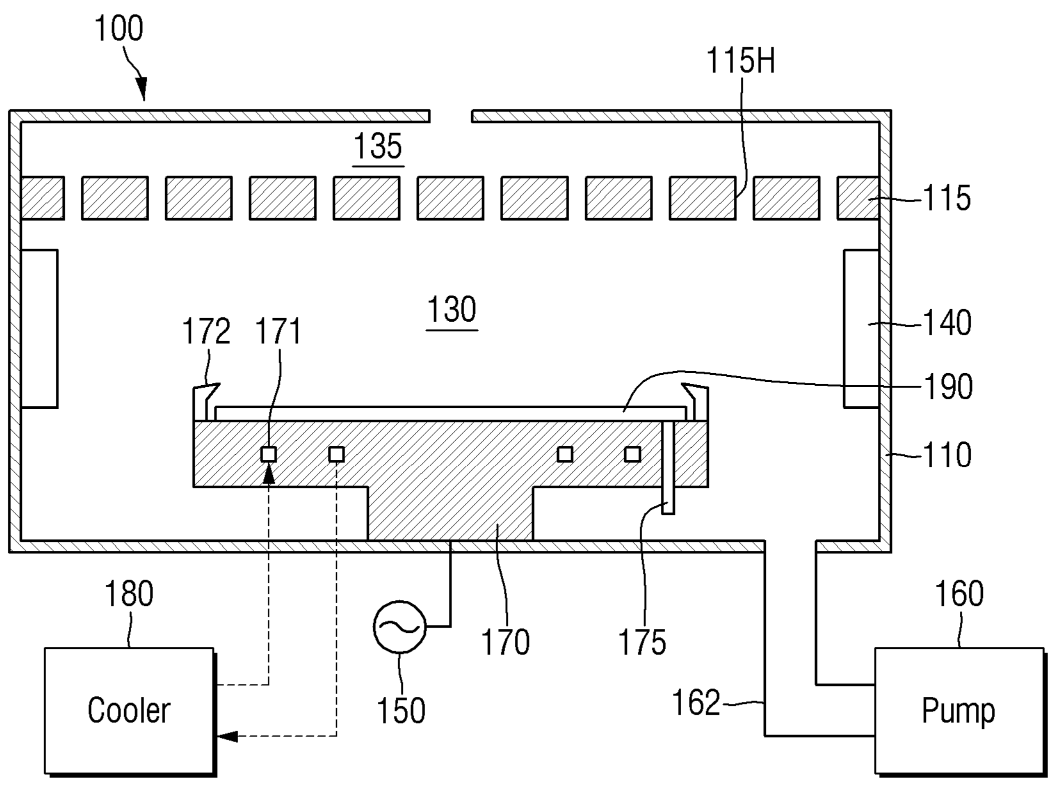

Referring to FIGS. 12 and 14, a deposition process may be performed on the substrate 190 (S220). The deposition process may include a chemical vapor deposition (CVD) method or an atomic layer deposition (ALD) method. After the deposition process is performed, a membrane material 140 may be formed on the inner wall of the housing 110. The membrane material 140 may be a by-product generated after the deposition process is performed. The membrane material 140 may include at least one of tungsten, tungsten nitride, silicon dioxide, titanium and titanium nitride, for example.

Figure 15:
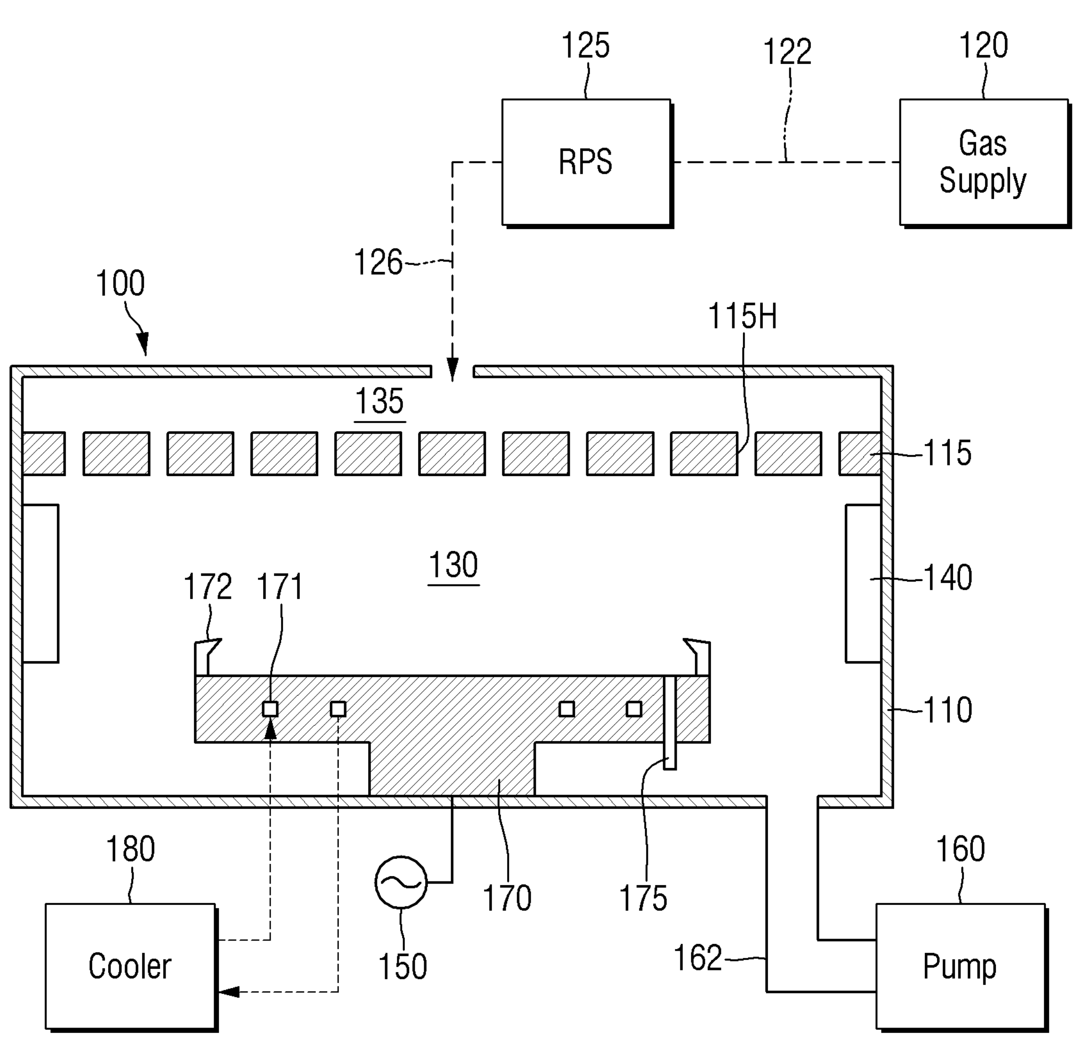

Referring to FIGS. 12 and 15, the substrate 190 may be unloaded from the substrate treatment apparatus (S230). Subsequently, the substrate treatment apparatus may be cleaned (S240). Cleaning the substrate treatment apparatus may be performed using the substrate processing method described with reference to FIGS. 3 to 11.

For example, the first process gas and the second process gas are supplied from the gas supply 120. The first process gas may be, for example, an argon (Ar) gas, and the second process gas may be, for example, a nitrogen trifluoride ($NF_3$) gas. In some embodiments, the flow rate at which the first process gas is supplied may be 1000 sccm to 15000 sccm. Preferably, the flow rate at which the first process gas is supplied may be 1000 sccm to 4000 sccm. More preferably, the flow rate at which the first process gas is supplied may be 3000 sccm to 4000 sccm. More preferably, the flow rate at which the first process gas is supplied may be 3500 sccm, but is not limited thereto.

Subsequently, the remote plasma supply 125 may generate a first process plasma and a second process plasma by plasma-processing the first process gas and the second process gas, respectively. The first process plasma and the second process plasma may be supplied into the process chamber 100. The second process plasma may be used to clean the membrane material 140 deposited on the inner wall of the housing 110.

Cleaning the membrane material 140 deposited on the inner wall of the housing 110 may include a first step and a second step. In the first step, the pressure inside the housing 110 may be set to a first pressure. In the second step, the pressure inside the housing 110 may be set to a second pressure. The first pressure may be greater than the second pressure. For example, the first pressure may be 1.0 torr to 5.0 torr, and the second pressure may be 0.2 torr to 1.0 torr. Preferably, the first pressure may be 2.0 torr, and the second pressure may be 0.5 torr. The first step may be performed prior to the second step.

By-products discharged after cleaning the membrane material 140 may be discharged to the outside of the housing 110 through the pump 160. When the substrate treatment apparatus is completely cleaned, the substrate 190 may be re-loaded, and a subsequent process may be performed on the substrate 190.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A substrate treatment apparatus comprising:
 a housing defining a treatment area in which a substrate is treated;
 a gas supply configured to supply a first process gas and a second process gas;
 a remote plasma supply connected to the gas supply, and configured to receive the first process gas and the second process gas and respectively generate a first process plasma and a second process plasma by applying RF power to plasma-process the first process gas and the second process gas;
 a shower head installed in the housing and connected to receive the first process plasma and the second process plasma and to supply the first process plasma and the second process plasma to the treatment area; and
 a controller, configured to:
 control the supply of the first process gas and the second process gas to cause the first process gas to be supplied at a flow rate of between 1000-3000 sccm and 15000 4000 sccm, and
 control the remote plasma supply to apply the RF power to the received process gas,
 wherein the second process plasma is configured to clean a membrane material when deposited on an inner wall of the housing,
 wherein the controller is configured to control the cleaning of the membrane material when deposited on the inner wall of the housing to include a first step executed at a first pressure inside the housing and a second step executed at a second pressure inside the housing, wherein the first pressure is greater than the second pressure, and
 wherein the first pressure is a pressure between 1.0 Torr and 2.0 Torr, and the second pressure is a pressure between 0.2 Torr and 0.5 Torr.

2. The substrate treatment apparatus of claim 1, wherein the first pressure is 2.0 torr, and the second pressure is 0.5 torr.

3. The substrate treatment apparatus of claim 1, wherein when the first step is executed at the first pressure inside the housing and the second step is executed at the second pressure inside the housing, a first cleaning rate for cleaning the membrane material deposited on the inner wall of the housing in the first step is slower than a second cleaning rate for cleaning the membrane material deposited on the inner wall of the housing in the second step.

4. The substrate treatment apparatus of claim 1, further comprising a pump connected to the housing, and configured to discharge by-products inside the housing to the outside of the housing.

5. The substrate treatment apparatus of claim 1, further comprising a substrate support unit, which supports the substrate, in the housing.

6. The substrate treatment apparatus of claim 1, wherein the first process gas is an argon (Ar) gas, and the second process gas is a nitrogen trifluoride ($NF_3$) gas.

7. The substrate treatment apparatus of claim 1, wherein the membrane material deposited on the inner wall of the housing includes at least one of tungsten, tungsten nitride, silicon dioxide, titanium or titanium nitride.

8. A substrate treatment apparatus comprising:
a housing defining a treatment area in which to perform a deposition process on a substrate;
a gas supply configured to supply an argon (Ar) gas and a process gas;
a remote plasma supply connected to the gas supply, and configured to receive the argon (Ar) gas and the process gas and to respectively generate an argon plasma and a process plasma by applying RF power to plasma-process the argon (Ar) gas and the process gas;
a shower head installed in the housing and connected to receive the argon plasma and the process plasma and to supply the argon (Ar) plasma and the process plasma to the treatment area;
a pump configured to adjust a pressure inside the housing between a first pressure and a second pressure,
wherein the process plasma is configured to clean a membrane material deposited on an inner wall of the housing; and
a controller, configured to:
control the deposition process so that the cleaning of the membrane material deposited on the inner wall of the housing includes a first step executed at the first pressure and a subsequent second step executed at the second pressure which is less than the first pressure, and
control the deposition process to include a chemical vapor deposition (CVD) method and an atomic layer deposition (ALD) method,
wherein the first pressure is a pressure between 1.0 Torr and 2.0 Torr, and the second pressure is a pressure between 0.2 Torr and 0.5 Torr.

9. The substrate treatment apparatus of claim 8, wherein the membrane material includes at least one of tungsten, tungsten nitride, silicon dioxide, titanium or titanium nitride.

10. A substrate treatment apparatus comprising:
a housing defining a treatment area for treating a substrate;
a gas supply connected to supply a first process gas from a first source and a second process gas from a second source;
a remote plasma supply connected to the gas supply, and configured to receive the first process gas and the second process gas and respectively generate a process plasma based on the first process gas and the second process gas by applying RF power to plasma-process the first process gas and the second process gas;
a shower head installed in the housing and connected to receive the process plasma and to supply the process plasma to the treatment area; and
a controller, configured to:
control the supply of the first process gas and the second process gas to cause the first process gas to be supplied at a flow rate of between 1000-3000 sccm and 15000 4000 sccm, and
control the remote plasma supply to apply the RF power to the received process gas, and
change a pressure inside the housing from a first pressure to a second pressure lower than the first pressure, after a period of time,
wherein the process plasma is configured to clean a membrane material when deposited on an inner wall of the housing, and
wherein the controller is configured to:
control the supply of the first process gas and second process gas, such that:
the first pressure is a pressure between 1.0 Torr and 2.0 Torr, and the second pressure is a pressure between 0.2 Torr and 1 Torr.

11. The substrate treatment apparatus of claim 10, wherein the second pressure is a pressure between 0.2 Torr and 0.5 Torr.

* * * * *